United States Patent
Lee et al.

(10) Patent No.: US 11,209,291 B2
(45) Date of Patent: Dec. 28, 2021

(54) METHOD AND APPARATUS FOR MONITORING A RESOLVER

(71) Applicant: GM GLOBAL TECHNOLOGY OPERATIONS LLC, Detroit, MI (US)

(72) Inventors: Young Joo Lee, Rochester, MI (US); Anno Yoo, Rochester, MI (US); Milan A. Vadera, Rochester Hills, MI (US); Daniel J. Berry, Macomb Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 386 days.

(21) Appl. No.: 16/506,387

(22) Filed: Jul. 9, 2019

(65) Prior Publication Data

US 2021/0010832 A1  Jan. 14, 2021

(51) Int. Cl.
*G01D 5/244* (2006.01)
*G01R 31/34* (2020.01)

(52) U.S. Cl.
CPC ......... *G01D 5/24457* (2013.01); *G01R 31/34* (2013.01)

(58) Field of Classification Search
CPC .......... G01D 5/24457; G01D 5/24471; G01D 5/24476; G01D 5/246; G01D 5/248; G01R 31/34
See application file for complete search history.

(56) References Cited

U.S. PATENT DOCUMENTS

| | | | |
|---|---|---|---|
| 2004/0189496 A1* | 9/2004 | Hagi | G01D 5/24476 341/117 |
| 2018/0172486 A1* | 6/2018 | Zirkel | G01D 5/20 |
| 2018/0231401 A1* | 8/2018 | Okumura | G01D 5/2449 |
| 2018/0306833 A1* | 10/2018 | Kaufner | G01P 3/44 |
| 2020/0103254 A1* | 4/2020 | Poezart | H04L 67/12 |

* cited by examiner

*Primary Examiner* — Steven L Yeninas
(74) *Attorney, Agent, or Firm* — Quinn IP Law (57) ABSTRACT

A resolver disposed to monitor a rotatable member is described, along with an associated method for evaluating an output signal therefrom. The method for monitoring the resolver includes supplying an excitation signal to the resolver, and monitoring, at an oversampling rate, first and second output signals from the resolver. An oversampling routine is executed to determine averages of the first and second output signals from the resolver. A demodulation angle error is determined based upon the first and second output signals from the resolver, and provided as feedback. A position of the resolver is also determined based upon the first and second output signals from the resolver.

19 Claims, 4 Drawing Sheets

METHOD AND APPARATUS FOR MONITORING A RESOLVER

INTRODUCTION

A resolver is an electromechanical transducer that includes a rotor having an excitation winding that is coupled to a rotatable member of a device, and a stator having secondary windings that are coupled to a non-rotating member of the device, wherein electromagnetic coupling between the primary winding and the secondary windings varies with the rotational position of the rotor. The primary winding may be excited with a sinusoidal signal, which induces differential output signals in the secondary windings. The magnitude of the electrical coupling onto the secondary windings relates to the rotational position of the rotor relative to that of the stator and an attenuation factor known as the resolver transformation ratio. In certain embodiments, the resolver is a variable reluctance resolver, in which an excitation winding is disposed in the stator, and an airgap between the rotor and the stator is modulated by the rotor, which modulates the transformation ratio depending on the rotational position. The output signals from the secondary windings may be phase-shifted by 90 degrees of rotation with respect to each other as a result of the secondary windings being mechanically displaced by 90/PP degrees of mechanical rotation, wherein PP is the quantity of pole pairs of the resolver. Thus, electrical rotation is determined based upon mechanical rotation divided by a quantity of electrical pole pairs. The primary winding may be excited with a sine wave reference signal, which induces differential output signals on the secondary windings. The relationships between the resolver input and the differential output signals may be used to determine a sine and a cosine of the rotational angle of the rotor. Thus, the relationships between the resolver input signal and the resolver output signals may be analyzed to dynamically determine an angular position and rotational speed of the rotor, and thus the rotating member.

Electric motors and other devices that include rotatable members may employ resolvers to monitor rotational position and rotational speed thereof. By way of non-limiting example, powertrain systems may employ electrically-powered torque machines to generate tractive torque for propulsion. Known torque machines include multiphase electric motor/generators that electrically couple to energy storage devices via high-voltage electric buses and inverter modules. Torque machines may use resolvers to monitor rotational position and rotational speed, and use such information for control and operation thereof.

Known systems employing resolvers have resolver-to-digital conversion integrated circuit devices to process input signals from the resolver to generate information related to rotational position and control that may be employed by a controller for controlling and monitoring operation.

SUMMARY

A resolver disposed to monitor a rotatable member is described, along with an associated method for evaluating an output signal therefrom. The method for monitoring the resolver includes supplying an excitation signal to the resolver, and monitoring, at an oversampling rate, first and second output signals from the resolver. An oversampling routine is executed to determine averages of the first and second output signals from the resolver. A demodulation angle error is determined based upon the first and second output signals from the resolver and provided as feedback. A position of the resolver is also determined based upon the first and second output signals from the resolver.

An aspect of the disclosure includes detecting a fault associated with the resolver based upon the monitoring of the first and second output signals from the resolver at the oversampling rate.

Another aspect of the disclosure includes capturing a plurality of first states associated with the first output signal at the oversampling rate, and capturing a plurality of second states associated with the second output signal at the oversampling rate, separating the plurality of first states into a plurality of first subsets, and separating the plurality of second states into a plurality of second subsets, determining a plurality of first parameters, wherein the first parameters are determined based upon the plurality of first subsets, and determining a plurality of second parameters, wherein the second parameters are determined based upon the plurality of second subsets.

Another aspect of the disclosure includes determining the demodulation angle error based upon the plurality of first parameters and the plurality of second parameters.

Another aspect of the disclosure includes determining the demodulation angle error in accordance with:

$$\Delta\theta_{Err} = (a_0 + a_2) - (a_1 + a_3)$$

wherein:
$\Delta\theta_{Err}$ is the demodulation angle error;
and wherein:

$$a_0 = |c_0 + j*s_0|, \quad a_1 = |c_1 + j*s_1|$$

$$a_2 = |c_2 + j*s_2|, \quad a_3 = |c_3 + j*s_3|$$

wherein $s_0$, $s_1$, $s_2$ and $s_3$ comprise the plurality of first parameters; and
wherein $c_0$, $c_1$, $c_2$ and $c_3$ comprise the plurality of second parameters.

Another aspect of the disclosure includes determining a polarity for the demodulation angle error based upon the plurality of first parameters and the plurality of second parameters.

Another aspect of the disclosure includes determining the polarity for the demodulation angle error in accordance with:

$$Plrty = ((c_0*c_1 + s_0*s_1)/(a_0*a_1) + (c_2*c_3 + s_2*s_3)/(a_2*a_3))*0.5.$$

Another aspect of the disclosure includes determining a first average based upon the plurality of first parameters, determining a second average based upon the plurality of second parameters, and detecting a fault associated with the resolver based upon the first average and the second average.

Another aspect of the disclosure includes the first sampling rate being 1/100 µs.

Another aspect of the disclosure includes the second sampling rate being 1/6.67 µs.

Another aspect of the disclosure includes supplying a sinusoidal excitation signal to the resolver.

Another aspect of the disclosure includes a controller for monitoring a resolver rotatably coupled to a rotatable member of an electric machine, wherein the resolver includes an excitation winding and first and second secondary windings. The controller includes an analog-to-digital converter, an interface circuit connected to the excitation winding and first and second secondary windings of the resolver, and an instruction set that is executable to supply an excitation signal to the excitation winding, monitor, at an oversampling rate, first and second output signals from the first and second secondary windings, and execute an oversampling routine to determine a demodulation angle error, and determine a position of the resolver.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

Figure 1:
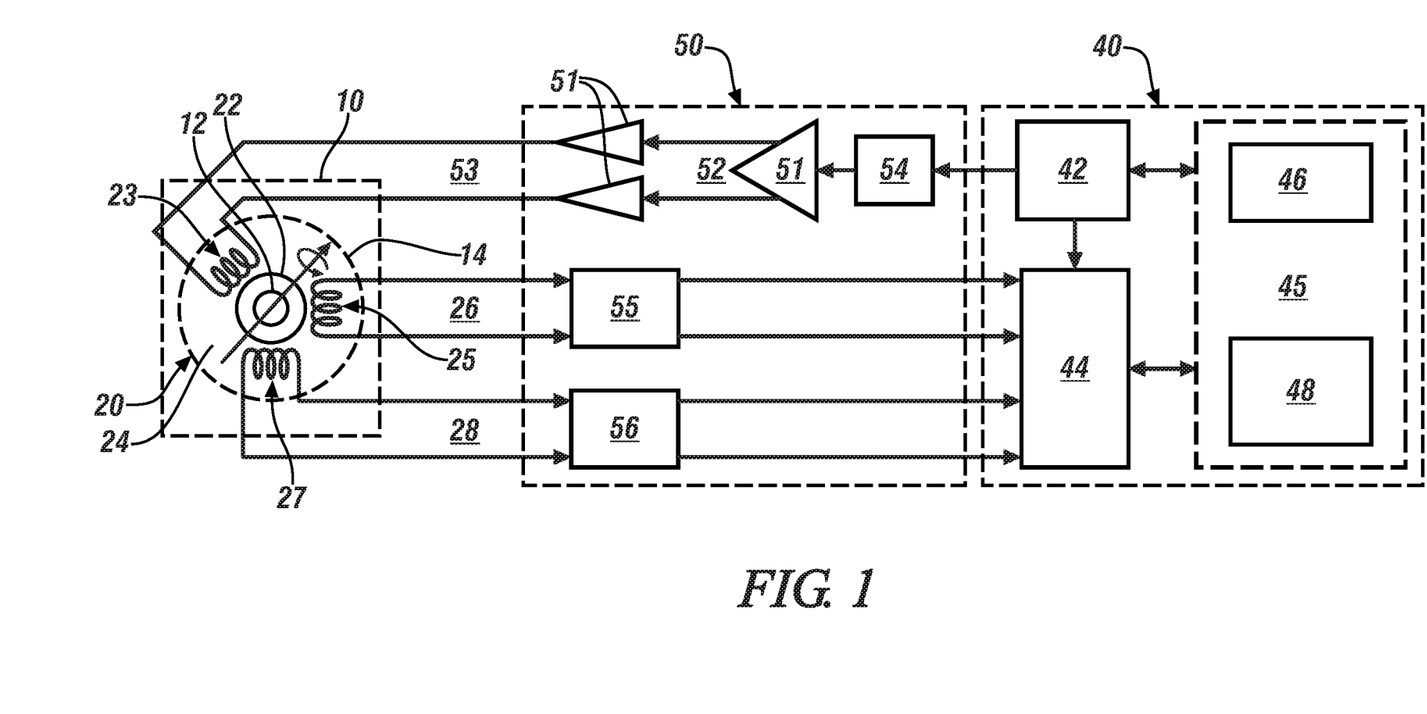
FIG. 1 schematically illustrates a resolver and associated control system for monitoring rotation of a rotatable device, in accordance with the disclosure.

Referring now to the drawings, wherein the depictions are for the purpose of illustrating certain exemplary embodiments and not for the purpose of limiting the same, FIG. 1 schematically illustrates details of a resolver 20 that is arranged to monitor a device 10 having a rotatable member 12. In one embodiment, the device 110 is an electric motor 10, and the rotatable member 12 is a rotor 12 that is disposed in a stator 14 and couples to a load (not shown). Rotational position of the rotor 12 is monitored by the resolver 20, which is coupled to a controller 40 via an interface circuit 50. Operation of the device 10, including rotational speed and/or position of the rotor 12, is controlled via a motor controller (not shown). The resolver 20 may be disposed in a location for monitoring rotational position and/or rotation speed of the rotor 12. The load may be, by way of a non-limiting example, a gear box coupled to a drive wheel that interacts with a ground surface when employed as part of a powertrain system for a ground vehicle. The concepts described within may apply to various configurations of a resolver 20 that is arranged to determine rotational position and/or speed of a rotatable member 12 of a device 10.

The resolver 20 includes a resolver rotor 22 that fixedly attaches to the rotor 12, and a resolver stator 24 that attaches to a grounding element, e.g., the device 10. The resolver rotor 22 includes a primary electrical winding referred to herein as an excitation winding 23, and the resolver stator 24 includes two secondary electrical windings referred to herein as first and second secondary windings 25, 27, respectively. Alternatively, the resolver 20 may be a variable reluctance resolver having the excitation winding 23 and the first and second secondary windings 25, 27 disposed on the resolver stator 24, wherein rotation of the resolver rotor 22 modulates an airgap therebetween to generate output signals in the form of first and second secondary signals 26, 28 on the first and second secondary windings 25, 27.

Figure 2:
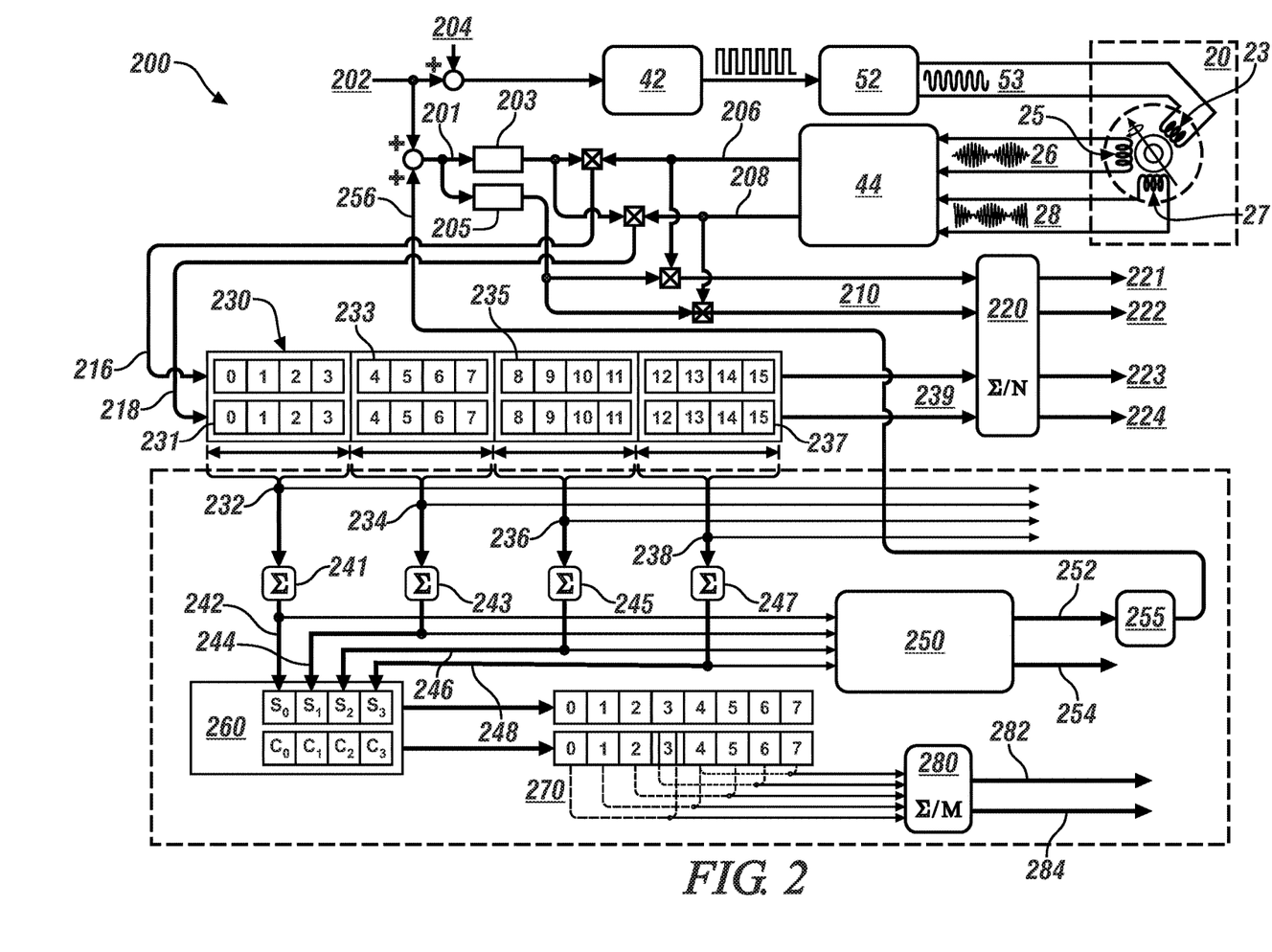
FIG. 2 schematically illustrates an oversampling routine for monitoring, sampling and processing secondary signals output from an embodiment of the resolver that is described with reference to FIG. 1, in accordance with the disclosure.

The excitation winding 23 and the first and second secondary windings 25, 27 operate as variable coupling transformers. In operation, the excitation module 42 and excitation circuit 52 of the controller 40 employ timers, a low-pass filter 54, and multiple amplifiers 51 to generate an excitation signal 53 based upon a first angular position $\theta_{ext}$ 202 in combination with a correction factor $\Delta\theta_{ext}$ 204, as shown in FIG. 2, and a first sampling period To. The excitation signal 53, which may be in the form of an analog sinusoidal reference signal, is provided to the excitation winding 23. In certain embodiments, the sinusoidal reference signal has a frequency in a range between 1 kHz and 15 kHz. The first and second secondary windings 25, 27 generate the first secondary signal 26 and the second secondary signal 28, respectively, in response to the excitation signal 53, wherein the first secondary signal 26 is a sine wave and the second secondary signal 28 is a cosine wave. The first and second secondary signals 26, 28 are subjected to respective line filters 55, 56 and communicated to an analog/digital converter (ADC) 44. The ADC 44 is an element of the controller 40, which also includes executable software routines 45 including a diagnostic routine 46 and a signal processing routine 48. The first and second secondary windings 25, 27 are mechanically rotatably displaced by 90/PP degrees of mechanical rotation, wherein PP is the quantity of pole pairs of the resolver about the axis of rotation of the rotor 12. The first and second secondary signals 26, 28 generated by the first and second secondary windings 25, 27 are sine and cosine signals that can be subjected to signal processing that includes digitization and demodulation to dynamically determine a rotational angle of the rotor 12 as described herein. The resolver 20 may be configured with a single pole pair for the first and second secondary windings 25, 27, meaning that 360 degrees of mechanical rotation of the rotor 12 generates a signal indicating 360 degrees of electrical rotation from the resolver rotor 22. Alternatively, the resolver 20 may be configured with multiple pole pairs for the first and second secondary windings 25, 27. By way of example, when the resolver 20 is configured with two pole pairs, 180 degrees of mechanical rotation of the rotor 12 generates a signal indicating 360 degrees of electrical rotation from the resolver rotor 22, and when the resolver 20 is configured with three pole pairs, 120 degrees of mechanical rotation of the rotor 12 generates a signal indicating 360 degrees of electrical rotation from the resolver rotor 22.

The amplitudes of the first and second secondary signals 26, 28 transmitted from the respective secondary windings 25, 27 vary sinusoidally as a function of the rotational position of the resolver rotor 22. Under ideal conditions, i.e., when no fault is present in the resolver 20 and when the second secondary winding 27 is precisely offset by 90° of mechanical rotation from the first secondary winding 25, the amplitudes of the first and second secondary signals 26, 28 are expected to be identical but offset by a phase of 90° degrees. In order to extract position information, the excitation signal 53 that is modulating the first and second secondary signals 26, 28 in the form of sine and cosine signals is removed by demodulation. The demodulated position information can then be used to determine rotational position and speed of the resolver rotor 22 and for diagnostic purposes.

There may be one or more errors between the rotational angle as measured by the resolver 20 and the rotational angle of the rotor 12 of the device 10. The errors may be in the form of mechanical error differences between the rotational angle as measured by the resolver 20 and the rotational angle of the rotor 12 due to resolver displacement or mechanical twisting when torque is applied. Furthermore, there may be an electrical signal error difference between the rotational angle as measured by the resolver 20 and the rotational angle of the rotor 12 due to signal latencies such as signal filtering and communication delays.

The controller 40 and related elements such as a control module, module, control, control unit, processor and similar terms refer to one or various combinations of Application Specific Integrated Circuit(s) (ASIC), electronic circuit(s), central processing unit(s), e.g., microprocessor(s) and associated non-transitory memory component in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions, including monitoring inputs from sensing devices and other networked controllers and executing control and diagnostic instructions to control operation of actuators. Routines may be executed at regular intervals, for example each 100 microseconds during ongoing operation. Alternatively, routines may be executed in response to occurrence of a triggering event. Communication between controllers, and communication between controllers, actuators and/or sensors may be accomplished using a direct wired link, a networked communication bus link, a wireless link or another suitable communication link. Communication includes exchanging data signals, including, for example, electrical signals via a conductive medium, electromagnetic signals via air, optical signals via optical waveguides, and the like. Data signals may include analog, digitized analog, and discrete signals representing inputs from sensors, actuator commands, and communication between controllers. The term 'model' refers to a processor-based or processor-executable code and associated calibration that simulates a physical existence of a device or a physical process. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

The ability to detect resolver signal errors may decrease as rotational speed increases due to narrower detection time windows.

A process for evaluating an output signal from an embodiment of the resolver 20 that monitors rotational position of the rotor 12 of the device 10 described herein with reference to FIG. 1 is now described, and includes supplying an excitation signal to the resolver 20, and periodically monitoring, at an oversampling rate, first and second secondary signals 26, 28 that are transmitted from the respective secondary windings 25, 27 that are output from the resolver 20. The signal processing routine 48 includes an oversampling routine 200, which is executed to periodically monitor the first and second secondary signals 26, 28 from the resolver 20. The oversampling routine 200 determines a demodulation angle error, and a position of the resolver is determined based upon the demodulation angle error. Furthermore, the diagnostic routine 46 can be arranged to execute fault monitoring and diagnostics based upon the results of the oversampling routine 200, which may result in detecting a fault associated with the resolver 20. Aspects of the diagnostic routine 46 are shown graphically and described with reference to FIG. 6.

FIG. 2, with continued reference to FIG. 1, schematically illustrates the oversampling routine 200 for evaluating an output signal from an embodiment of the resolver 20 that is coupled to a rotatable member, to advantageously detect a resolver-related fault over a range of rotational speeds. Overall, the oversampling routine 200 includes supplying an excitation signal to the resolver 20, and periodically acquiring, at an oversampling rate $1/(T_0/N)$, the first and second secondary signals 26, 28 transmitted from the respective secondary windings 25, 27 from the resolver 20, wherein the first sampling period $T_0$ is set to a baseline sampling period, e.g., 100 microseconds, and wherein the baseline sampling period is selected to calculate the average of oversampled N data to provide noise immunity from external electromagnetic interference.

The oversampling routine 200 may be employed to detect resolver signal error across a wide range of rotational speeds, and facilitate adjustment of demodulation timing and a demodulation angle to extract evenly distributed multi-numbered sine and cosine signals. The oversampling routine 200 includes oversampling to adjust demodulation timing and angle of the output signals of the resolver 20, thus extending the resolver speed range over which monitoring and diagnostics of a software resolver-digital conversion (RDC) may be accomplished, as compared to a system without this capability. As employed herein, the term "oversampling" and related terms refer to monitoring and data capture at a second sampling rate that is greater than a first, baseline sampling rate that is employed for purposes of controlling rotational speed and/or rotational position of the rotor 12 of the device 10.

During operation, the ADC 44 periodically acquires the first and second secondary signals 26, 28 that are output from the resolver 20 at an over-sampling period $T_0/N$, which may be on the order of magnitude of 100/16 microseconds (μs), where e.g., N=16 is oversampling rate.

The ADC 44 periodically acquires the first and second secondary signals 26, 28 at the baseline sampling rate $1/T_0$, and also executes analog-to-digital conversion of the sampled first and second secondary signals 26, 28 at the over-sampling rate $1/(T_0/N)$. Furthermore, the ADC 44 is capable of storing the converted values into the memory buffer 237. As such, the first and second secondary signals 26, 28 from the resolver 20 are oversampled at the sampling rate $1/(T_0/N)$, wherein the second sampling rate is greater than the baseline sampling rate $1/T_0$ at which compute the average of N oversampled data per $T_0$ period, intending a good aforementioned electro-magnetic interference. The ADC 44 transfers data in the form of the oversampled first and second secondary signals 26, 28 to a state buffer 230, and every baseline sampling period $T_0$, a quantity of M data subsets with a quantity of L elements each are transferred to the state buffer 230, wherein L and M are selected to meet the oversampling time $T_0/M$ and $N=L \cdot M$, where L, M, and N are integer numbers.

In one embodiment, the baseline sampling period $T_0$ may be set at a rate of 100 microseconds (μs), and the baseline sampling rate may be 1/100 μs. In one embodiment, the ADC 44 may be capable of oversampling N times during the baseline sampling period $T_0$, and thus the second, oversampling period may be set at $T_0/N$ μs. In one embodiment, the N value may be set at 16, and the second, oversampling period may be set at 100/16 μs, i.e., 6.67 μs.

The oversampled outputs of the ADC 44 include a set of first, sine states 206 that are captured as a first array, and a set of second, cosine states 208 that are captured as a second array, which are designated as sin_adc_buf[0 . . . N−1] 206 and cos_adc_buf[0 . . . N−1] 208, respectively. The sine states 206 and cosine states 208 are transferred to the state buffer 230 after signal processing, and employed to determine a demodulation error $\Delta\theta_{demod}$ 256. The signal processing relates to demodulating the first and second secondary signals 26, 28 with the excitation signal 53 to extract position information of the rotor 22, wherein the excitation signal 53 is adjusted by the first angular position $\theta_{ext}$ 202 that has been additively combined with the demodulation error $\Delta\theta_{demod}$ 256 to determine an error correction term $(\theta_{ext} + \Delta\theta_{demod})$ 201, which can be formed into associated sin-error 203 and cos-error 205 terms that can be combined with the respective sine states 206 and cosine states 208.

The sin-error 203 and cos-error 205 terms are also combined with the respective cosine buffer 208 and sine buffer 206 to determine corresponding sine and cosine quadrature buffer terms 210 (sin_quad_raw_buf[0 . . . N−1], cos_quad_raw_buf[0 . . . N−1]), which are input to an averaging routine 220 to determine corresponding raw sine and cosine quadrature average terms 221, 222, respectively.

The resultant states include demodulated sine states 216 and demodulated cosine states 218, which are input to the state buffer 230, wherein the state buffer 230 has N quantity of buffer elements, in this case 16, enumerated 0-15 for the demodulated sine states 216, and N quantity of buffer elements, in this case 16, enumerated 0-15 for the demodulated cosine states 218. The state buffer 230 is configured to accommodate the outputs of the ADC 44 wherein signals are sampled N times during the first, baseline sampling period To.

The demodulated sine states 216 and demodulated cosine states 218 of the state buffer 230 are segmented into a plurality of data subsets, composed as a first data subset 231 including elements 0, 1, 2, 3 of the state buffer 230; a second data subset 233 including elements 4, 5, 6, 7 of the state buffer 230; a third data subset 235 including elements 8, 9, 10, 11 of the state buffer 230; and a fourth data subset 237 including elements 12, 13, 14, 15 of the state buffer 230, as shown.

The demodulated sine states 216 and demodulated cosine states 218 of the state buffer 230, in the form of the are also sin_raw_buf[0 . . . N−1] and cos_raw_buf[0 . . . N−1] terms 239 are input to the averaging routine 220 to determine corresponding raw sine and cosine average terms 223, 224, respectively.

The raw sine and cosine quadrature average terms 221, 222 and the raw sine and cosine average terms 223, 224 are employed as position feedback to control the device 10.

The first, second, third, and fourth data subsets 231, 233, 235, 237 are output as samples $\sin \& \cos_{avg\_qrtr\_smpld\_1}$ 232, $\sin \& \cos_{avg\_qrtr\_smpld\_2}$ 234, $\sin \& \cos_{avg\_qrtr\_smpld\_3}$ 236, $\sin \& \cos_{avg\_qrtr\_smpld\_4}$ 238, which are input to respective summing elements 241, 243, 245, 247, to generate respective sine and cosine parameters 242, 244, 246, 248.

The contents of the first data subset 231 are output to summing element 241, which generates parameters $S_0$ and $C_0$ 242, as follows, are stored in a second memory buffer 260, and are represented as follows:

$$s_0 = \Sigma \text{ sin\_raw\_buf}[0 \ldots 3]$$

$$c_0 = \Sigma \text{ cos\_raw\_buf}[0 \ldots 3] \tag{242}$$

The contents of the second data subset 233 are output to summing element 243, which generates parameters $S_1$ and $C_1$ 244, as follows, are stored in the second memory buffer 260, and are represented as follows:

$$s_1 = \Sigma \text{ sin\_raw\_buf}[4 \ldots 7]$$

$$c_1 = \Sigma \text{ cos\_raw\_buf}[4 \ldots 7] \tag{244}$$

The contents of the third data subset 235 are output to summing element 245, which generates parameters $S_2$ and $C_2$ 246, as follows, are stored in the second memory buffer 260, and are represented as follows:

$$s_2 = \Sigma \text{ sin\_raw\_buf}[8 \ldots 11]$$

$$c_2 = \Sigma \text{ cos\_raw\_buf}[8 \ldots 11] \tag{246}$$

The contents of the fourth data subset 237 are output to summing element 247, which generates parameters $S_3$ and $C_3$ 248, as follows, are stored in the second memory buffer 260, and are represented as follows:

$$s_3 = \Sigma \text{ sin\_raw\_buf}[12 \ldots 15]$$

$$c_3 = \Sigma \text{ cos\_raw\_buf}[12 \ldots 15] \tag{248}$$

The contents of the second memory buffer 260 are pushed into a third memory buffer 270, which is a FIFO (first-in, first-out) buffer, the contents of which are input to an averaging routine 280 to calculate an average sine subset value 282 for each of the data subsets 231, 233, 235, 237, and an average cosine subset value 284 for each of the data subsets 231, 233, 235, 237. The average sine subset value 282 and the average cosine subset value 284 are represented as follows:

$$\sin_{avg\_sub\_raw}[0 \ldots M] \tag{282}$$

$$\cos_{avg\_sub\_raw}[0 \ldots M] \tag{284}$$

The average sine subset value 282 and the average cosine subset value 284 may be employed for monitoring and diagnostics of the resolver 20, as described in further detail with reference to FIGS. 4 and 6.

The parameters $S_0$ and $C_0$ 242, $S_1$ and $C_1$ 244, $S_2$ and $C_2$ 246, and $S_3$ and $C_3$ 248 are subjected to an analysis step 250, which is in the form of the following set of equations to determine a demodulation angle error $\Delta\theta_{Err}$ 252 as follows:

$$a_0=|c_0+j*s_0|, \ a_1=|c_1+j*s_1|$$

$$a_2=|c_2+j*s_2|, \ a_3=|c_3+j*s_3| \quad [1]$$

The demodulation angle error $\Delta\theta_{Err}$ 252 may be determined as follows:

$$\Delta\theta_{Err}=(a_0+a_2)-(a_1+a_3) \quad [2]$$

The demodulation angle error $\Delta\theta_{Err}$ 252 is subjected to a gain term 255 to determine the demodulation error $\Delta\theta_{demod}$ 256, which is provided as feedback into the demodulation steps.

The polarity term (Plrty) 254 may be determined as follows:

$$\text{Plrty}=((c_0*c_1+s_0*s_1)/(a_0*a_1)+(c_2*c_3+s_2*s_3)/(a_2*a_3))*0.5 \quad [3]$$

Figure 3:
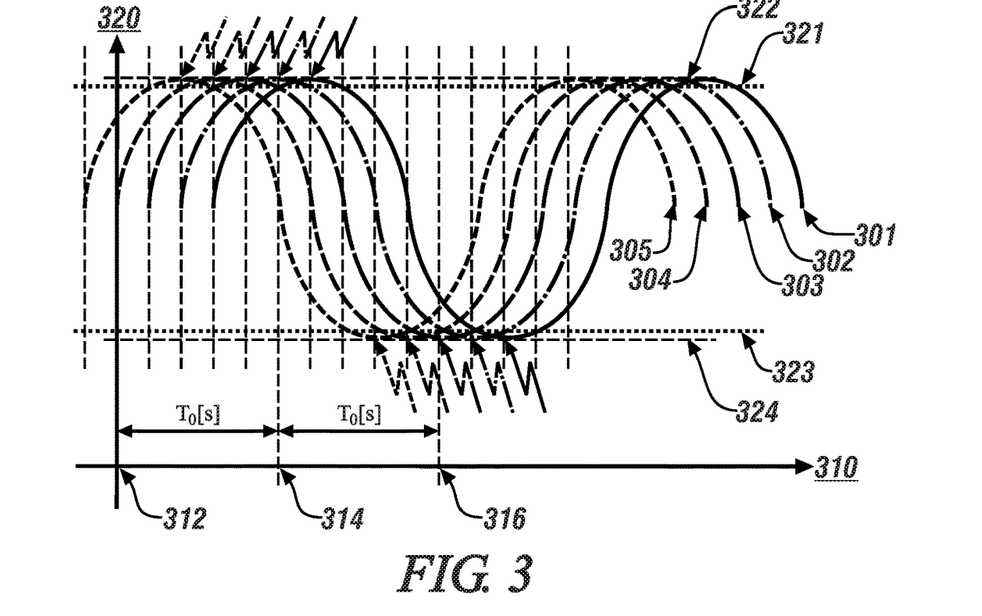
FIG. 3 graphically shows data associated with operation of a resolver, including secondary signals that are generated by secondary windings of the resolver, in accordance with the disclosure.

FIG. 3 graphically shows a plurality of sinusoidal waveforms plotted as signal amplitude 320 in relation to time 310, wherein an original waveform 301 represents an output signal from the first secondary winding 25 or the second secondary winding 27 of the resolver 20 that is described with reference to FIG. 1. The sinusoidal waveforms include the original waveform 301, and a plurality of evenly-distributed secondary sinusoidal waveforms 302, 303, 304 and 305, which can be extracted from the original waveform 301 and reconstructed by oversampling and adjusting the demodulation timing or angle. Sampling points 312, 314 and 316 are also shown on the time axis 310, and are evenly spaced and represent the sampling period To. As appreciated, another quantity of sampling points may be selected. Other data includes an upper amplitude threshold 321, a lower amplitude threshold 323, an upper amplitude (squared value) 322 and a lower amplitude (squared value) 324. The upper amplitude threshold 321 and the lower amplitude threshold 323 are selected to indicate a fault with the resolver 20. The secondary sinusoidal waveform 302 may be analogous to either of the first secondary signal 26 generated by the first secondary winding 25 or the second secondary signal 28 generated by the second secondary winding 27, as described with reference to FIG. 2. The data is generated by rotation of the rotor 12 and the resolver rotor 22.

Figure 4:
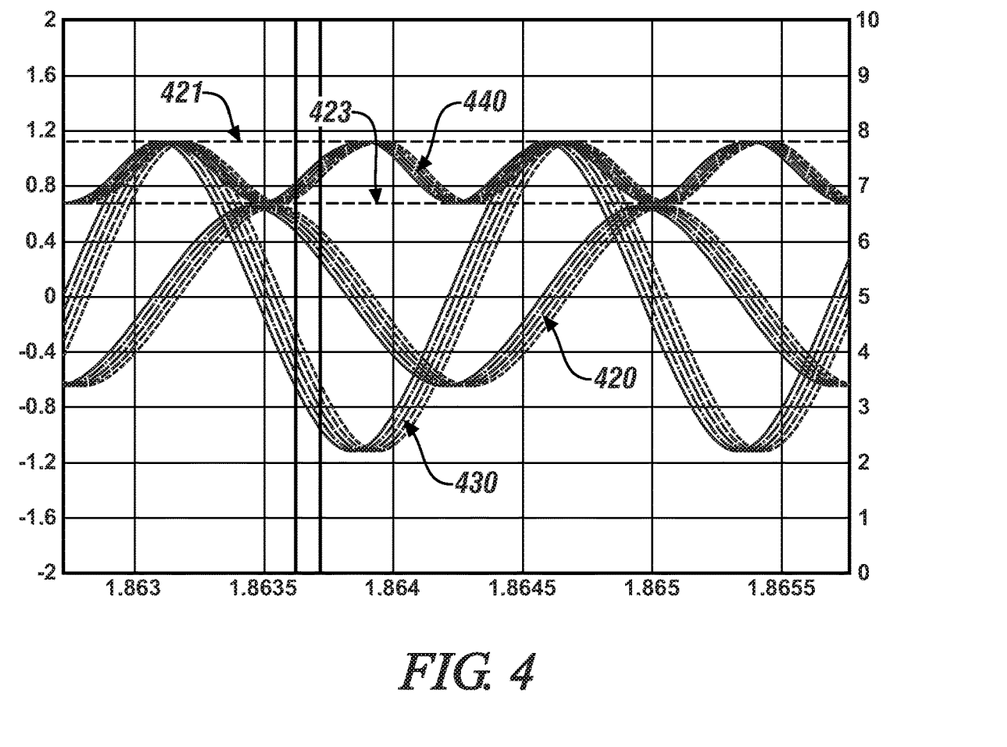
FIG. 4 graphically shows data associated with operation of a resolver, including waveforms associated with the secondary signals and subjected to an oversampling routine in accordance with the disclosure.

Referring now to FIG. 4, with continued reference to FIGS. 1 and 2, sets of original waveforms that are output from the resolver 20 and subjected to the oversampling routine 200 are shown, analogous to the waveforms shown with reference to FIG. 3. A first set of the waveforms 420 represents the average sine subset value 282 that has been determined based upon the first secondary signal 26 from the first secondary winding 25 of the resolver 20 after having been subjected to the oversampling routine 200. A second set of the waveforms 430 represents the average cosine subset value 284 that has been determined based upon the second secondary signal 28 from the second secondary winding 27 of the resolver 20 after having been subjected to the oversampling routine 200. A third set of the waveforms 440 represents an analysis of the first and second sets of the waveforms 420, 430, and subjected to the following analysis:

$$(A\cos(\omega_r t))^2 + (B\sin(\omega_r t))^2 \quad [4]$$

Also shown are an upper amplitude threshold 421 and a lower amplitude threshold 423. Under ideal conditions (not shown), i.e., when no fault is present in the resolver 20 and when the second secondary winding 27 is precisely offset by 90° of mechanical rotation from the first secondary winding 25, the amplitudes of the first and second sets of waveforms 420, 430 are expected to be identical but offset by a phase of 180 degrees, and the amplitudes of the third set of waveforms 440 as determined by Eq. 4, are expected to be flat-lined. As shown, a fault has been introduced in the resolver 20 and its signal processing circuitry that affects the magnitude and phase of the second set of waveforms 430. Such a fault may be caused by deterioration in signal processing circuitry, mechanical displacement of the first secondary winding 25 from the second secondary winding 27, etc. The introduction of the fault into the resolver 20 causes the third set of waveforms 440 to be sinusoidal, at a period that is half the periods of the first and second sets of waveforms 420, 430. As shown, the amplitude of the third set of waveforms 440 exceeds the upper amplitude threshold 421 and is less than the lower amplitude threshold 423, indicating a fault with the resolver 20 that is detectable by the oversampling method described with reference to FIG. 2.

Figure 5:
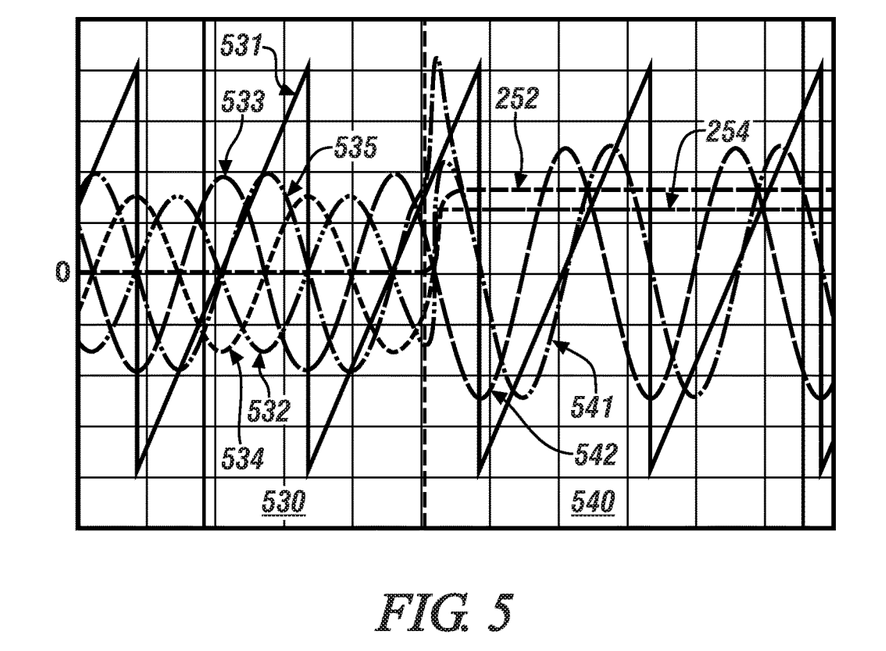
FIG. 5 graphically shows data associated with operation of a resolver, including data that is determined employing an oversampling routine for determining a demodulation error, in accordance with the disclosure.

FIG. 5 graphically data output from the resolver 20 described with reference to FIG. 1, including a portion of the data being determined employing the oversampling routine 200 described with reference to FIG. 1. Plotted data includes a first portion 530, during which the oversampling routine 200 is monitoring but not actively adjusting demodulation timing of the resolver 20, i.e., the demodulation error $\Delta\theta_{demod}$ 256 (shown with reference to FIG. 2) is zero. Plotted data during the first portion 530 includes an angular position θ 531, and sinusoidal outputs in the following form:

$$A\sin(\omega_r t)[0,2] \quad 535,$$

$$A\sin(\omega_r t)[1,3] \quad 532,$$

$$A\cos(\omega_r t)[0,2] \quad 533, \text{ and}$$

$$A\cos(\omega_r t)[1,3] \quad 534.$$

The polarity term 254 is negative, i.e., at negative 1.0 as shown.

Plotted data also includes a second portion 540, during which the oversampling routine 200 is monitoring and is actively adjusting demodulation timing of the resolver 20, i.e., the demodulation error $\Delta\theta_{demod}$ 256 (shown with reference to FIG. 2) is provided as feedback. Plotted data during the second portion 540 includes the angular position θ 531, and sine outputs in the following form:

$$B\sin(\omega_r t)[0, \ldots 3] \quad 541, \text{ and}$$

$$A\cos(\omega_r t)[0, \ldots 3] \quad 542.$$

The polarity term 254 is positive, i.e., at positive 1.0 as shown.

The results indicate a lack of disparity between the first and third data subsets 231, 235 when compared to the second and fourth data subsets 233, 237 when operating with the demodulation error $\Delta\theta_{demod}$ 256 that is determined by the oversampling routine 200 being provided as feedback.

The average sine subset value 282 and the average cosine subset value 284 that have been determined based upon the first secondary signal 26 from the first secondary winding 25 of the resolver 20 after having been subjected to the oversampling routine 200 may be advantageously employed to evaluate the resolver 20 to detect occurrence of a fault in a timely manner.

Figure 6:
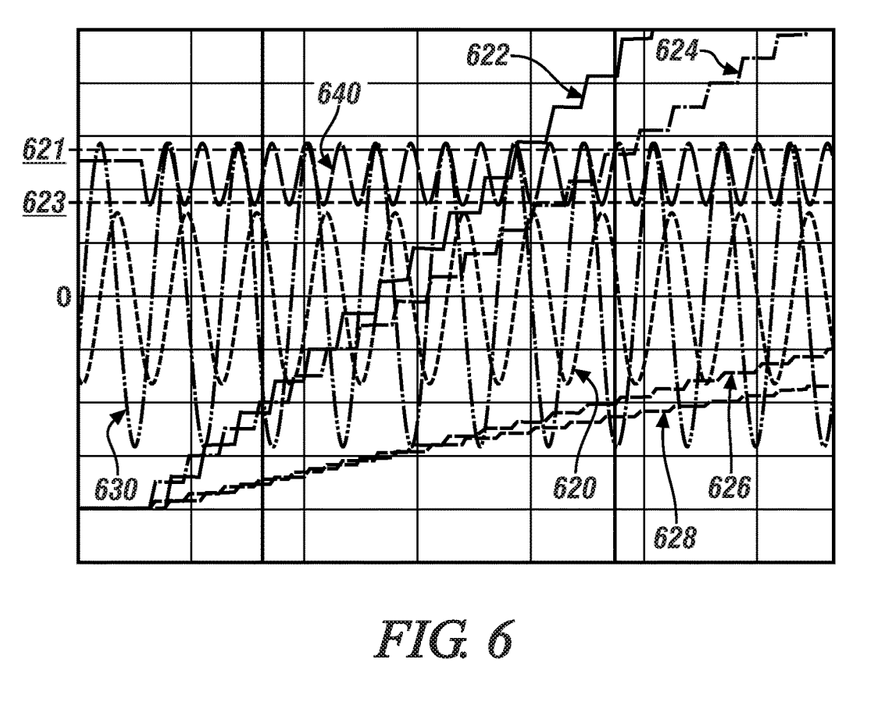
FIG. 6 graphically shows data associated with operation of a resolver, including data that is determined employing an oversampling routine for resolver fault monitoring, in accordance with the disclosure.

Referring now to FIG. 6, with continued reference to FIGS. 1 and 2, sets of original waveforms that are output from the resolver 20 and subjected to the oversampling routine 200 are shown, including $A\cos(\omega_r t)$. In this embodiment, a fault has been introduced into the resolver 20 and its signal processing circuitry that affects the magnitude and phase of second set of waveforms 630. A first set of the waveforms 620 represents the average sine subset value 282, i.e., A sin($\omega_r$t), that has been determined based upon the first secondary signal 26 from the first secondary winding 25 of the resolver 20 after having been subjected to the oversampling routine 200. A second set of the waveforms 630 represents the average cosine subset value 284, i.e., A cos($\omega_r$t), that has been determined based upon the second secondary signal 28 from the second secondary winding 27 of the resolver 20 after having been subjected to the oversampling routine 200. A third set of the waveforms 640 represents an analysis of the first and second sets of the waveforms 620, 630, and subjected to the following analysis:

$$(A\cos(\omega_r t))^2 + (B\sin(\omega_r t))^2 \qquad [5]$$

Also shown are an upper amplitude threshold 621 and a lower amplitude threshold 623.

Under ideal conditions (not shown), i.e., when no fault is present in the resolver 20 and when the second secondary winding 27 is precisely offset by 90° of mechanical rotation from the first secondary winding 25, the amplitudes of the first and second sets of waveforms 620, 630 are expected to be identical but offset by a phase of 180 degrees, and the amplitudes of the third set of waveforms 440 as determined by Eq. 5, are expected to be flat-lined. In the presence of a fault, the results, represented by the third set of the waveforms 640, will exceed the upper amplitude threshold 621 and/or the lower amplitude threshold 623.

Line 622 is an integer counter, and graphically captures when the third set of the waveforms 640 exceeds the upper amplitude threshold 621.

Line 624 is also an integer counter, and graphically captures when the third set of the waveforms 640 below the lower amplitude threshold 623.

By way of contrast, Line 626 is also an integer counter, and graphically captures when a baseline waveform, without benefit of the analysis of the oversampling routine 200 exceeds the upper amplitude threshold 621. In like manner, Line 628 is also an integer counter, and graphically captures when a baseline waveform, without benefit of the analysis of the oversampling routine 200 falls below the lower amplitude threshold 623.

The flowchart and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

The invention claimed is:

1. A method for evaluating a resolver disposed to monitor a rotatable member of a device, the method comprising:
   supplying an excitation signal to the resolver;
   monitoring, at an oversampling rate, first and second output signals from the resolver, wherein the oversampling rate is greater than a baseline sampling rate that is associated with controlling a rotational speed and a position of the rotatable member of the device;
   executing an oversampling routine to determine averages of the first and second output signals from the resolver;
   determining a demodulation angle error based upon the averages of the first and second output signals from the resolver; and
   determining a position of the resolver based upon the averages of the first and second output signals from the resolver.

2. The method of claim 1, further comprising detecting a fault associated with the resolver based upon the monitoring of the first and second output signals from the resolver at the oversampling rate.

3. The method of claim 1, wherein executing the oversampling routine comprises:
   capturing a plurality of first states associated with the first output signal at the oversampling rate, and capturing a plurality of second states associated with the second output signal at the oversampling rate;
   separating the plurality of first states into a plurality of first subsets, and separating the plurality of second states into a plurality of second subsets;
   determining a plurality of first parameters based upon the plurality of first subsets; and
   determining a plurality of second parameters based upon the plurality of second subsets.

4. The method of claim 3, wherein determining the demodulation angle error based upon the oversampling routine comprises determining the demodulation angle error based upon the plurality of first parameters and the plurality of second parameters.

5. The method of claim 4, wherein determining the demodulation angle error based upon the plurality of first parameters and the plurality of second parameters comprises determining the demodulation angle error in accordance with:

$$\Delta\theta_{Err} = (a_0 + a_2) - (a_1 + a_3)$$

wherein:
$\Delta\theta_{Err}$ is the demodulation angle error;
and wherein:

$$a_0 = |c_0 + j^* s_0|, \quad a_1 = |c_1 + j^* s_1|$$

$$a_2 = |c_2 + j^* s_2|, \quad a_3 = |c_3 + j^* s_3|$$

wherein $s_0$, $s_1$, $s_2$ and $s_3$ comprise the plurality of first parameters; and
wherein $c_0$, $c_1$, $c_2$ and $c_3$ comprise the plurality of second parameters.

6. The method of claim 5, further comprising determining a polarity for the demodulation angle error based upon the plurality of first parameters and the plurality of second parameters.

7. The method of claim 6, wherein determining the polarity for the demodulation angle error based upon the plurality of first parameters and the plurality of second parameters comprises determining the polarity (Plrty) for the demodulation angle error in accordance with:

$$Plrty=((c_0*c_1+s_0*s_1)/(a_0*a_1)+(c_2*c_3+s_2*s_3)/(a_2*a_3))*0.5.$$

8. The method of claim 3, further comprising:
determining a first average based upon the plurality of first parameters;
determining a second average based upon the plurality of second parameters; and
detecting a fault associated with the resolver based upon the first average and the second average.

9. The method of claim 1, wherein the baseline sampling rate comprises 1/100 μs.

10. The method of claim 1, wherein the oversampling rate comprises 1/6.67 μs.

11. The method of claim 1, wherein supplying the excitation signal to the resolver comprises supplying a sinusoidal excitation signal to the resolver.

12. A controller for monitoring a resolver rotatably coupled to a rotatable member of an electric machine, wherein the resolver includes an excitation winding and first and second secondary windings, the controller comprising:
an analog-to-digital converter;
an interface circuit connected to the excitation winding and first and second secondary windings of the resolver; and
an instruction set, the instruction set executable to:
supply an excitation signal to the excitation winding;
monitor, at an oversampling rate, first and second output signals from the first and second secondary windings;
execute an oversampling routine, including determining an average of the first and second output signals, wherein the oversampling rate is greater than a baseline sampling rate that is associated with control of a rotational speed and a position of the rotatable member of the electric machine;
determine a demodulation angle error based upon the oversampling routine; and
determine a position of the resolver based upon the oversampling routine.

13. The controller of claim 12, wherein the instruction set is further executable to detect a fault associated with the resolver based upon the oversampling routine.

14. The controller of claim 12, wherein the excitation signal comprises a sinusoidal excitation signal.

15. The controller of claim 12, wherein the instruction set executable to execute the oversampling routine comprises the instruction set executable to:
monitor, at the oversampling rate, the first and second output signals from the resolver,
capture a plurality of first states associated with the first output signal at the oversampling rate, and capturing a plurality of second states associated with the second output signal at the oversampling rate;
separate the plurality of first states into a plurality of first subsets, and separating the plurality of second states into a plurality of second subsets;
determine a plurality of first parameters, wherein the first parameters are determined based upon the plurality of first subsets; and
determine a plurality of second parameters, wherein the second parameters are determined based upon the plurality of second subsets.

16. The controller of claim 15, wherein the instruction set is further executable to determine the demodulation angle error based upon the plurality of first parameters and the plurality of second parameters.

17. The controller of claim 16, wherein the instruction set is executable to determine the demodulation angle error in accordance with:

$$\Delta\theta_{Err}=(a_0+a_2)-(a_1+a_3)$$

wherein:
$\Delta\theta_{Err}$ is the demodulation angle error;
and wherein:

$$a_0=|c_0+j*s_0|,\ a_1=|c_1+j*s_1|$$

$$a_2=|c_2+j*s_2|,\ a_3=|c_3+j*s_3|$$

wherein $s_0$, $s_1$, $s_2$ and $s_3$ comprise the plurality of first parameters; and
wherein $c_0$, $c_1$, $c_2$ and $c_3$ comprise the plurality of second parameters.

18. The controller of claim 16, wherein the instruction set is executable to determine a polarity for the demodulation angle error based upon the plurality of first parameters and the plurality of second parameters.

19. The controller of claim 18, wherein the instruction set is executable to determine the polarity (Plrty) for the demodulation angle error in accordance with:

$$Plrty=((c_0*c_1+s_0*s_1)/(a_0*a_1)+(c_2*c_3+s_2*s_3)/(a_2*a_3))*0.5.$$

\* \* \* \* \*